(12) United States Patent
Yu et al.

(10) Patent No.: US 12,382,806 B2
(45) Date of Patent: Aug. 5, 2025

(54) DISPLAY SUBSTRATE AND MANUFACTURING METHOD THEREFOR, AND DISPLAY APPARATUS

(71) Applicant: BOE TECHNOLOGY GROUP CO., LTD., Beijing (CN)

(72) Inventors: Yang Yu, Beijing (CN); Fangxu Cao, Beijing (CN); Pinfan Wang, Beijing (CN); Wenqiang Li, Beijing (CN); Chunyan Xie, Beijing (CN); Bo Wang, Beijing (CN); Jingquan Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 497 days.

(21) Appl. No.: 17/915,678

(22) PCT Filed: Sep. 3, 2021

(86) PCT No.: PCT/CN2021/116522
§ 371 (c)(1),
(2) Date: Sep. 29, 2022

(87) PCT Pub. No.: WO2022/083321
PCT Pub. Date: Apr. 28, 2022

(65) Prior Publication Data
US 2023/0255074 A1    Aug. 10, 2023

(30) Foreign Application Priority Data

Oct. 22, 2020   (CN) .......................... 202011140961.4

(51) Int. Cl.
*H10K 59/131* (2023.01)
*H10K 59/12* (2023.01)
(Continued)

(52) U.S. Cl.
CPC ..... *H10K 59/1315* (2023.02); *H10K 59/1201* (2023.02); *H10K 59/80521* (2023.02); *H10K 59/873* (2023.02); *H10K 77/111* (2023.02)

(58) Field of Classification Search
CPC .......... H10K 59/1315; H10K 59/1201; H10K 59/80521; H10K 59/873; H10K 77/111;
(Continued)

(56) References Cited

U.S. PATENT DOCUMENTS 11,910,660 B2 * 2/2024 Jia ..................... H10K 59/80515
2020/0136089 A1 * 4/2020 Zhang ................. H10K 50/844
(Continued)

FOREIGN PATENT DOCUMENTS

CN        110544714 A      12/2019
CN        111244133 A       6/2020
(Continued)

*Primary Examiner* — J. E. Schoenholtz
(74) *Attorney, Agent, or Firm* — XSENSUS LLP

(57) ABSTRACT

A display substrate includes a flexible substrate, a cathode layer located on a first side of the flexible substrate and at least one insulating layer located between the flexible substrate and the cathode layer. The flexible substrate includes at least one stretchable region, the stretchable region extends from the display area to the non-display area, and the stretchable region is provided with a plurality of holes arranged in an array therein. A border of the cathode layer is located in the non-display area. The at least one insulating layer is configured to expose the plurality of holes, the at least one insulating layer is provided with at least one partition groove therein, an orthographic projection of a partition groove on the flexible substrate is disposed around a hole of the plurality of holes, and the partition groove is configured to partition the cathode layer.

18 Claims, 6 Drawing Sheets

(51) Int. Cl.
*H10K 59/80* (2023.01)
*H10K 77/10* (2023.01)

(58) Field of Classification Search
CPC .... H10K 50/11; H10K 50/822; H10K 59/124; H10K 59/131; Y02E 10/549; Y02P 70/50
See application file for complete search history.

(56) References Cited

U.S. PATENT DOCUMENTS

| | | | |
|---|---|---|---|
| 2020/0168824 A1 | 5/2020 | Park et al. | |
| 2021/0358343 A1* | 11/2021 | Wang | H10K 77/111 |
| 2022/0013596 A1* | 1/2022 | Kim | H10K 59/35 |
| 2022/0085124 A1 | 3/2022 | Sui et al. | |
| 2023/0157146 A1* | 5/2023 | Han | H10K 77/111 257/40 |

FOREIGN PATENT DOCUMENTS

| | | | |
|---|---|---|---|
| CN | 111584595 A | 8/2020 |
| CN | 111584606 A | 8/2020 |
| CN | 111799392 A | 10/2020 |
| CN | 112271196 A | 1/2021 |

* cited by examiner

B-B'

DISPLAY SUBSTRATE AND MANUFACTURING METHOD THEREFOR, AND DISPLAY APPARATUS

CROSS-REFERENCE TO RELATED APPLICATIONS

This application is a national phase entry under 35 USC 371 of International Patent Application No. PCT/CN2021/116522, filed on Sep. 3, 2021, which claims priority to Chinese Patent Application No. 202011140961.4, filed on Oct. 22, 2020, which are incorporated herein by reference in their entirety.

TECHNICAL FIELD

The present disclosure relates to the field of display technologies, and in particular, to a display substrate and a manufacturing method thereof, and a display apparatus.

BACKGROUND

Display apparatuses, such as active-matrix organic light-emitting diode (AMOLED) display apparatuses, have advantages of being able to individually control each sub-pixel to perform display, high contrast ratio, bright colors and the like.

SUMMARY

In an aspect, a display substrate is provided. The display substrate has a display area and a non-display area adjacent to the display area. The display substrate includes: a flexible substrate, the flexible substrate including at least one stretchable region, the stretchable region extending from the display area to the non-display area, and the stretchable region being provided with a plurality of holes arranged in an array therein; a cathode layer located on a first side of the flexible substrate, the cathode layer extending from the display area to the non-display area, and a border of the cathode layer being located in the non-display area; and at least one insulating layer located between the flexible substrate and the cathode layer, the at least one insulating layer being configured to expose the plurality of holes, the at least one insulating layer being provided with at least one partition groove therein, an orthographic projection of a partition groove on the flexible substrate being disposed around a hole of the plurality of holes, and the partition groove being configured to partition the cathode layer.

In some embodiments, the display substrate further includes a light-emitting functional layer located between the cathode layer and the at least one insulating layer. The light-emitting functional layer extends from the display area to the non-display area, and a border of the light-emitting functional layer is located between the border of the cathode layer and a border of the display area. The at least one partition groove includes partition grooves, and at least a part of the partition grooves each partition both of the cathode layer and the light-emitting functional layer.

In some embodiments, a section obtained by sectioning the partition groove with a plane parallel to both of a radial direction of the hole and a thickness direction of the display substrate is substantially in a shape of an inverted "T".

In some embodiments, the at least one insulating layer includes a first inorganic insulating layer and a first organic insulating layer that are sequentially away from the cathode layer; the partition groove passes through the first inorganic insulating layer and at least a portion of the first organic insulating layer.

In some embodiments, the display substrate further includes at least one signal line disposed on the first side of the flexible substrate and located in the non-display area. A signal line has at least one first avoidance opening, and a first avoidance opening is configured to expose the hole. The at least one insulating layer covers a sidewall of the first avoidance opening; alternatively, the at least one insulating layer covers the sidewall of the first avoidance opening and a portion, proximate to the first avoidance opening, of a surface of the signal line away from the flexible substrate.

In some embodiments, the signal line includes a first metal layer and a second metal layer that are sequentially away from the flexible substrate; the at least one insulating layer includes a first organic insulating layer and a second organic insulating layer that are sequentially proximate to the flexible substrate. The second organic insulating layer covers a side of the first metal layer proximate to the hole and a portion of a surface of the first metal layer away from the flexible substrate. The second metal layer is in electrical contact with the first metal layer, and the second metal layer covers a side of the second organic insulating layer away from the hole and a portion of a surface of the second organic insulating layer away from the flexible substrate. The first organic insulating layer covers a side of the second metal layer proximate to the hole and a portion of a surface of the second metal layer away from the flexible substrate.

In some embodiments, the at least one insulating layer further includes a first inorganic insulating layer and a second inorganic insulating layer. A portion of the second inorganic insulating layer is located between the second organic insulating layer and the flexible substrate, another portion of the second inorganic insulating layer is located between the first metal layer and the second metal layer, and yet another portion of the second inorganic insulating layer is located between the first metal layer and the second organic insulating layer. The first inorganic insulating layer covers at least a portion of a surface of the first organic insulating layer away from the flexible substrate, a side of the first organic insulating layer proximate to the hole and a side of the second organic insulating layer proximate to the hole, and the first inorganic insulating layer is in contact with the second inorganic insulating layer.

In some embodiments, the signal line is a voltage signal line, and the voltage signal line is disposed around the display area. The display substrate further includes a cathode lapping layer located in the non-display area. The cathode lapping layer includes a first portion and a second portion connected to each other, the first portion is electrically connected to a surface of the cathode layer proximate to the flexible substrate, and the second portion is connected to a surface of the voltage signal line away from the flexible substrate. The cathode lapping layer has at least one second avoidance opening, and a second avoidance opening is configured to expose the hole. The at least one insulating layer covers a sidewall of the second avoidance opening; alternatively, the at least one insulating layer covers the sidewall of the second avoidance opening and a portion, proximate to the second avoidance opening, of a surface of the cathode lapping layer away from the flexible substrate.

In some embodiments, the display substrate further includes: a first blocking dam disposed on the first side of the flexible substrate, a second blocking dam disposed on the first side of the flexible substrate, and an encapsulation layer disposed on the first side of the flexible substrate. The first blocking dam is located in the non-display area and disposed around the display area. The first blocking dam covers at least a side of the voltage signal line away from the display area and a side of the cathode lapping layer away from the display area; the first blocking dam has at least one third avoidance opening, and a third avoidance opening is configured to expose another hole of the plurality of holes. The second blocking dam is located in the non-display area and disposed around the display area. The second blocking dam is located on a surface of the second portion of the cathode lapping layer away from the flexible substrate; the second blocking dam has at least one fourth avoidance opening, and a fourth avoidance opening is configured to expose the hole exposed by the second avoidance opening, the first avoidance opening and the second avoidance opening. The encapsulation layer covers the cathode layer, the first blocking dam and the second blocking dam; the encapsulation layer has at least one fifth avoidance opening, and a fifth avoidance opening is configured to expose a corresponding hole of the plurality of the holes.

In some embodiments, any one of the first avoidance opening, the second avoidance opening, the third avoidance opening, the fourth avoidance opening and the fifth avoidance opening is in a shape of a closed annulus.

In some embodiments, any one of the first avoidance opening, the second avoidance opening, the third avoidance opening, the fourth avoidance opening and the fifth avoidance opening is in a shape of an unclosed annulus.

In some embodiments, the display substrate is in a shape of a rectangle, a number of stretchable regions is four, and the four stretchable regions are respectively located at four corners of the display substrate; alternatively, the number of stretchable regions is one, and the stretchable region covers all of the display area and all of the non-display area.

In some embodiments, the plurality of holes arranged in the array include first holes each extending in a first direction and second holes each extending in a second direction intersecting the first direction. The first holes and the second holes are alternately arranged in both of the first direction and the second direction.

In another aspect, a display apparatus is provided. The display apparatus includes the display substrate as described in any one of the above embodiments.

In yet another aspect, a manufacturing method of a display substrate is provided. The display substrate has a display area and a non-display area adjacent to the display area. The manufacturing method includes: forming at least one insulating layer on a first side of a flexible substrate; forming a plurality of holes arranged in an array in a stretchable region of the flexible substrate, at least part of the plurality of holes passing through the at least one insulating layer, and the stretchable region extending from the display area to the non-display area; forming at least one partition groove in the at least one insulating layer, an orthographic of a partition groove on the flexible substrate being disposed around a hole; and forming a cathode layer on the flexible substrate on which the at least one insulating layer has been formed, the cathode layer extending from the display area to the non-display area, a border of the cathode layer being located in the non-display area, and the cathode layer being partitioned by the partition groove.

In some embodiments, before forming the cathode layer, the manufacturing method further includes: forming a light-emitting functional layer on the first side of the flexible substrate. The light-emitting functional layer extends from the display area to the non-display area, and a border of the light-emitting functional layer is located between the border of the cathode layer and a border of the display area. The at least one partition groove includes partition grooves, and at least a part of the partition grooves each partition both of the cathode layer and the light-emitting functional layer.

In some embodiments, the at least one insulating layer includes a first inorganic insulating layer and a first organic insulating layer that are sequentially away from the cathode layer. Forming the at least one partition groove on the at least one insulating layer includes: etching the first inorganic insulating layer and at least a portion of the first organic insulating layer by an etching process to form the at least one partition groove.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Figure 1:
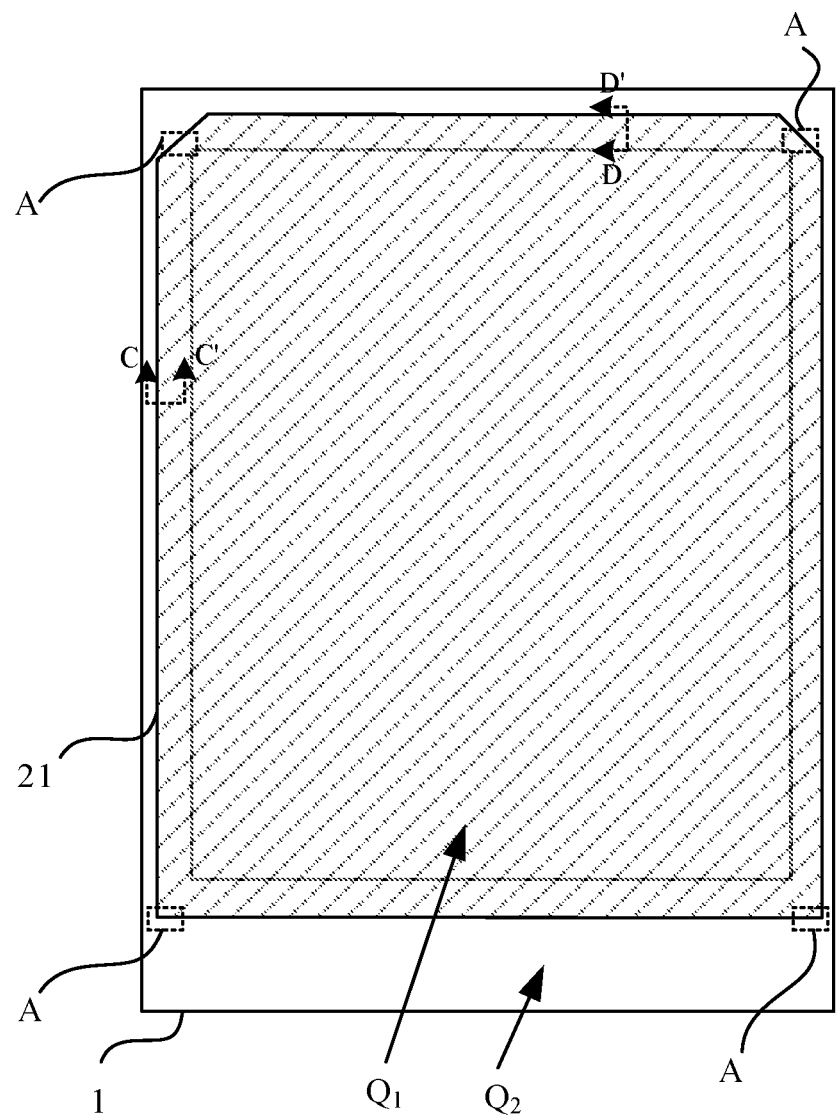
FIG. 1 is a diagram showing a structure of a display substrate, in accordance with some embodiments.

Technical solutions in some embodiments of the present disclosure will be described clearly and completely below with reference to the accompanying drawings.

Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

The phrase "applicable to" or "configured to" as used herein indicates an open and inclusive expression, which does not exclude devices that are applicable to or configured to perform additional tasks or steps.

Additionally, the phase "based on" as used herein is meant to be open and inclusive, since a process, step, a calculation or other action that is "based on" one or more of the stated conditions or values may, in practice, be based on additional conditions or values beyond those stated.

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a feature of being curved. Therefore, the regions shown in the accompanying drawings are schematic in nature, and their shapes are not intended to show actual shapes of regions in a device, and are not intended to limit the scope of the exemplary embodiments.

Figure 2:
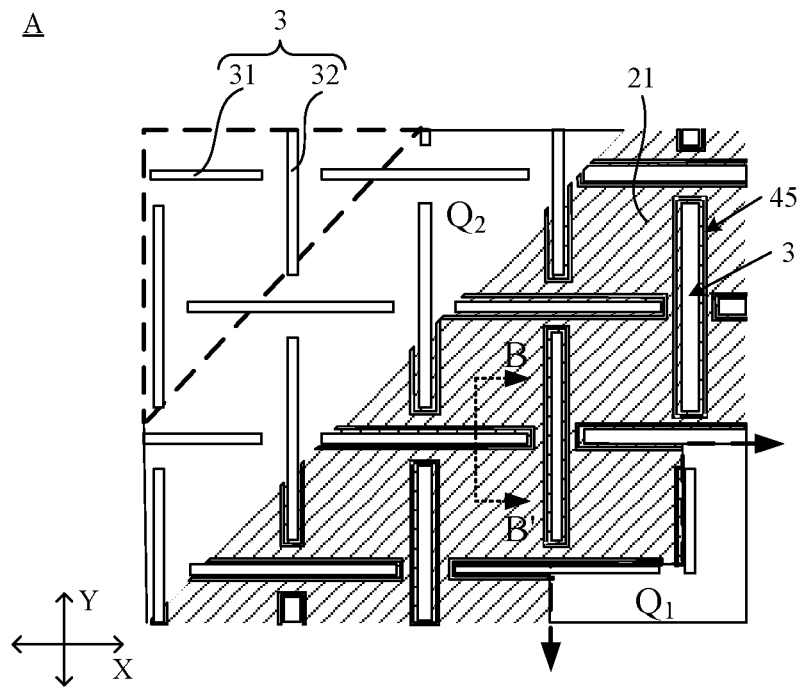
FIG. 2 is a diagram showing a partial structure of the display substrate in FIG. 1 in a stretchable region A.

Referring to FIGS. 1 and 2, some embodiments of the present disclosure provide a display substrate 100. The display substrate 100 has a display area $Q_1$ and a non-display area $Q_2$ adjacent to the display area $Q_1$. The non-display area $Q_2$ may be located only on one or more sides of the display area $Q_1$; alternatively, the non-display area $Q_2$ may be disposed in a circle around the display area $Q_1$ according to the example as shown in FIG. 1.

Figure 3:
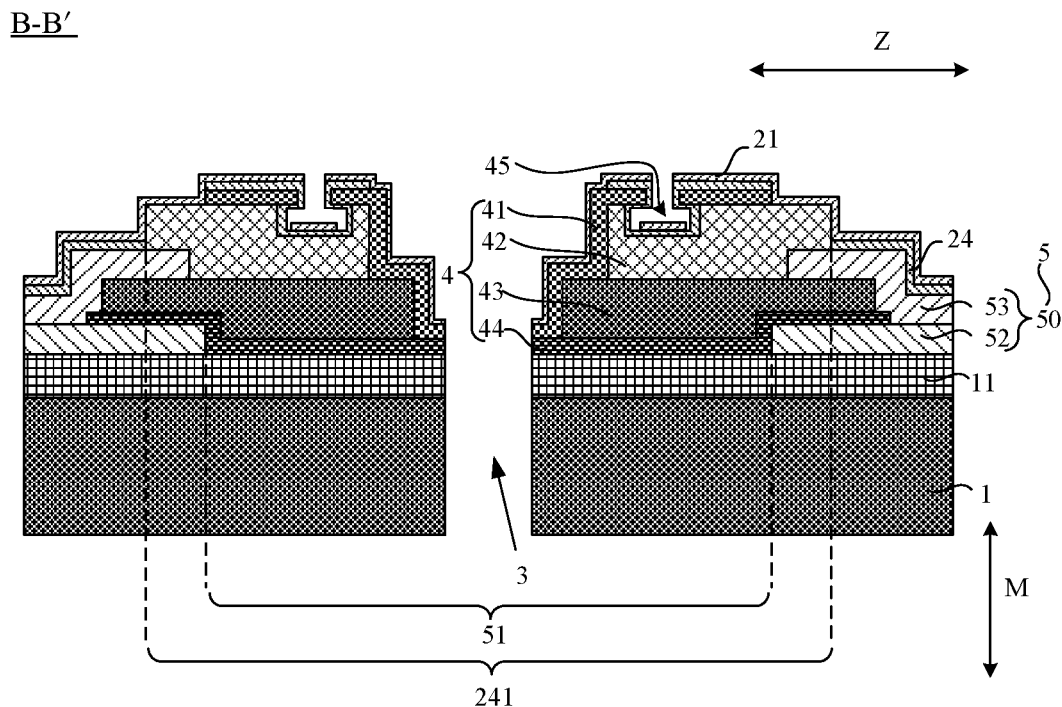
FIG. 3 is a diagram showing a sectional structure in the stretchable region A in FIG. 2 taken along the line B-B'.

As shown in FIG. 3, the display substrate 100 includes a flexible substrate 1, a cathode layer 21 located on a first side of the flexible substrate 1, and at least one insulating layer 4 located between the flexible substrate 1 and the cathode layer 21.

Figure 9:
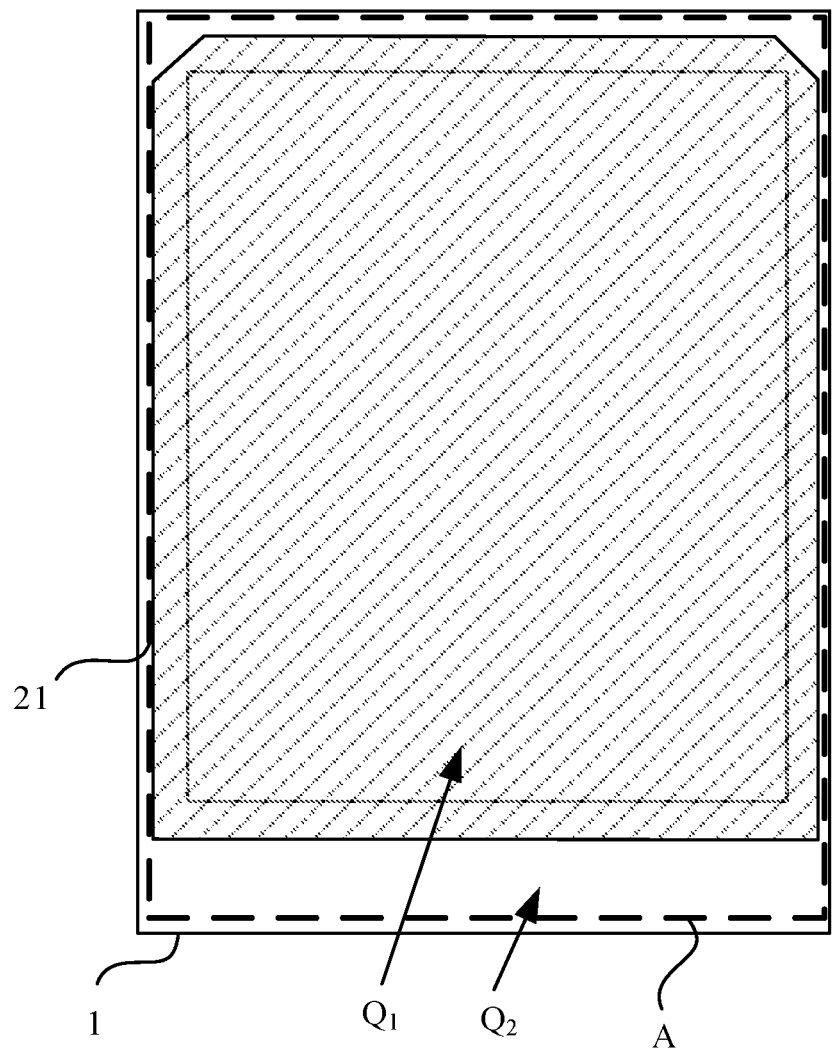
FIG. 9 is a diagram showing a structure of another display substrate, in accordance with some embodiments.

As shown in FIG. 1, the flexible substrate 1 includes at least one stretchable region A, and the stretchable region A extends from the display area $Q_1$ to the non-display area $Q_2$. In some examples, the display substrate 100 is in a shape of a rectangle, the number of stretchable regions A is four, and the four stretchable regions A are respectively located at four corners of the display substrate 100. In some other examples, as shown in FIG. 9, the number of stretchable regions A is one, and the stretchable region A covers all of the display area $Q_1$ and all of the non-display area $Q_2$.

As shown in FIG. 2, the stretchable region A is provided with a plurality of holes 3 arranged in an array therein. The specific arrangement manners of "the plurality of holes 3 arranged in an array" may vary. For example, as shown in FIG. 2, the plurality of holes 3 arranged in the array may include first holes 31 each extending in a first direction X and second holes 32 each extending in a second direction Y intersecting the first direction X. The first holes 31 and the second holes 32 are alternately arranged in both of the first direction X and the second direction Y. With this arrangement, it is conducive to making the flexible substrate 1 have good stretchability.

The second direction Y intersects the first direction X, which includes but is not limited to the manner that the second direction Y and the first direction X are perpendicular to each other as shown in FIG. 2. That is, an angle between the second direction Y and the first direction X is not limited to a right angle; alternatively, the angle may be an acute angle.

In a process of manufacturing the display substrate 100, holes 3 may be directly manufactured in a display substrate mother board, and then cutting is performed thereon to obtain the single display substrate 100. On this basis, referring to FIG. 2, the corner of the display substrate 100 (i.e., a position in the triangular dotted box in FIG. 2) may be cut to form a rounded corner, which facilitates application thereof to a display apparatus having a rounded corner. For example, as shown in FIG. 2, the corner to be cut is provided with holes 3 therein.

In some examples, the hole 3 is a via hole penetrating the flexible substrate 1. In some other examples, the hole 3 is a blind hole. It will be understood that in a case where the hole 3 is the blind hole, the hole 3 only has an opening on a first side of the flexible substrate 1. Moreover, the present disclosure does not limit a depth of the blind hole. That is, the depth of the blind hole may be determined according to the stretchability needed to be realized. For example, the greater the depth of the blind hole, the larger the stretchable range; and conversely, the less the depth of the blind hole, the smaller the stretchable range.

In the display substrate 100, the stretchable region A of the flexible substrate 1 extends from the display area $Q_1$ to the non-display area $Q_2$, and the plurality of holes 3 arranged in the array are disposed in the stretchable region A of the flexible substrate 1. Therefore, the flexible substrate 1 may be stretched in at least a part of the display area $Q_1$ and at least a part of the non-display area $Q_2$. With this design, in a case where the display substrate 100 is applied to a display apparatus, the display apparatus may achieve an effect of curved display by stretching the display substrate 100.

With continued reference to FIGS. 1 and 2, the cathode layer 21 extends from the display area $Q_1$ to the non-display area $Q_2$, and a border of the cathode layer 21 is located in the non-display area $Q_2$.

The at least one insulating layer 4 is configured to expose the plurality of holes 3, as shown in FIGS. 2 and 3, the at least one insulating layer 4 is provided with at least one partition groove 45 therein. An orthographic projection of a partition groove 45 on the flexible substrate 1 is disposed around a hole 3 (for example, the orthographic projection of the partition groove 45 on the flexible substrate 1 may be disposed around the hole 3 in a circle, or the orthographic projection of the partition groove 45 on the flexible substrate 1 may be disposed around the hole 3 only in a half circle or a one-third circle), and the partition groove 45 is configured to partition the cathode layer 21.

The partition groove 45 may be disposed, for example, in a portion of the at least one insulating layer 4 covered by the cathode layer 21. "The portion of the at least one insulating layer 4 covered by the cathode layer 21" refers to at least a portion of the at least one insulating layer 4 covered by a designed border of the cathode layer 21. It will be understood that in an actual manufacturing, for example, in a case where the cathode layer 21 is manufactured by an evaporation process, there may be a certain deviation between an actual evaporation border of the cathode layer 21 and the designed border of the cathode layer 21. Therefore, in an actual product, the partition groove 45 may be further disposed in a portion of the at least one insulating layer 4 not covered by the cathode layer 21.

In this way, after the display substrate is encapsulated, moisture may be prevented from permeating from a side of the partition groove 45 proximate to the hole 3 to a side of the partition groove 45 away from the hole 3 through the cathode layer 21, so as to ameliorate a problem that the moisture is prone to corrode the cathode layer 21 while the hole 3 is provided, thereby reducing an influence of the external moisture on the display substrate 100.

In conclusion, in the display substrate 100 provided by some embodiments of the present disclosure, the stretchable region A of the flexible substrate 1 extends from the display area $Q_1$ to the non-display area $Q_2$, and the plurality of holes 3 arranged in the array are disposed in the stretchable region A of the flexible substrate 1, so that the flexible substrate 1 may be stretched in at least a part of the display area $Q_1$ and at least a part of the non-display area $Q_2$. Furthermore, the at least one partition groove 45 is disposed in the at least one insulating layer 4, the orthographic projection of the partition groove 45 on the flexible substrate 1 is disposed around the hole 3, and the partition groove 45 is configured to partition the cathode layer 21, so that the moisture is prevented from permeating from the side of the partition groove 45 proximate to the hole 3 to the side of the partition groove 45 away from the hole 3 through the cathode layer 21. As a result, the problem that the moisture is prone to corrode the cathode layer 21 to cause poor display in the display area of the display substrate 100 is ameliorated while achieving a stretchable effect by providing the holes 3.

Figure 4:
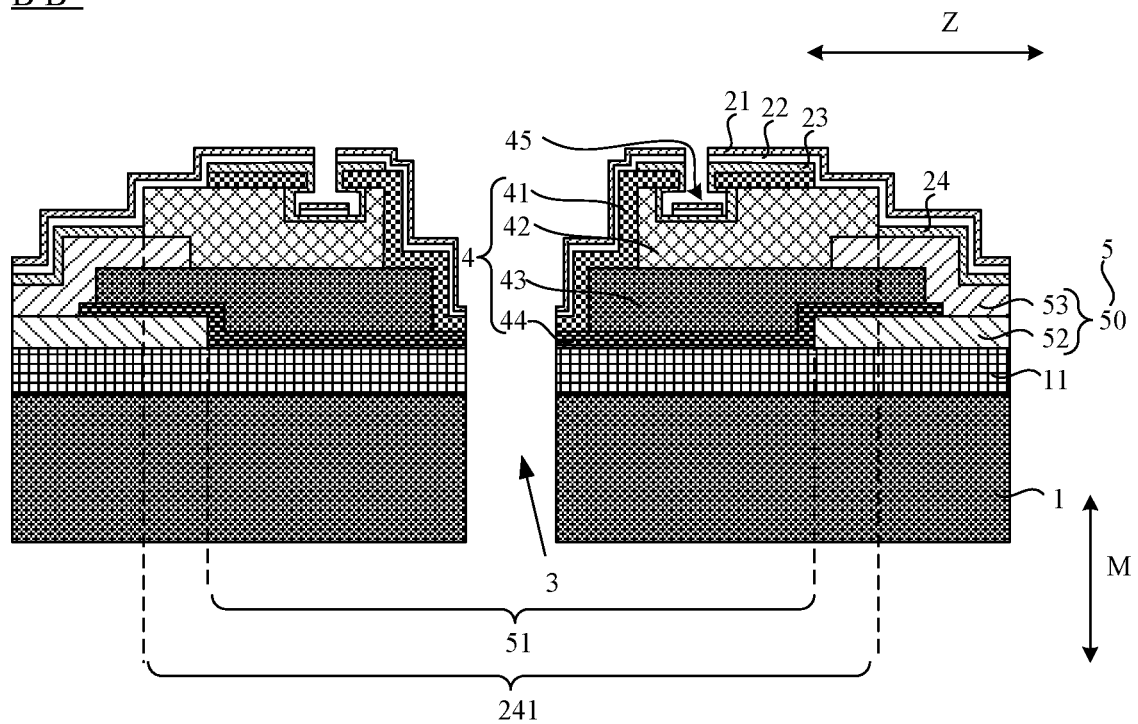
FIG. 4 is a diagram showing another sectional structure in the stretchable region A in FIG. 2 taken along the line B-B'.

In some embodiments, as shown in FIG. 4, the display substrate 100 further includes a light-emitting functional layer 22 (e.g., an electron transporting layer, an electron injection layer, an organic light-emitting layer, a hole injection layer and a hole transporting layer) located between the cathode layer 21 and the at least one insulating layer 4. The light-emitting functional layer 22 extends from the display area $Q_1$ to the non-display area $Q_2$, and a border of the light-emitting functional layer 22 is located between the border of the cathode layer 21 and a border of the display area $Q_1$. At least a part of the partition grooves 45 each partition both of the cathode layer 21 and the light-emitting functional layer 22.

In this way, after the display substrate is encapsulated, the moisture may be prevented from permeating from the side of the partition groove 45 proximate to the hole 3 to the side of the partition groove 45 away from the hole 3 through the light-emitting functional layer 22, so as to ameliorate a problem that the moisture is prone to corrode the light-emitting functional layer 22 and the cathode layer 21 while the hole 3 is provided, thereby reducing the influence of the external moisture on the display substrate 100.

In some examples, referring to FIG. 4, the display substrate further includes an anode layer, and the anode layer includes a plurality of anodes 23 corresponding to a plurality of sub-pixels. For example, the anode 23 manufactured on the partition groove 45 may be attached to an inner wall of the partition groove 45.

In some embodiments, referring to FIGS. 3 and 4, a section obtained by sectioning the partition groove 45 with a plane parallel to both of a radial direction Z of the hole 3 and a thickness direction M of the display substrate 100 is substantially in a shape of an inverted "T". With this design, it is conducive to partitioning both of the light-emitting functional layer 22 and the cathode layer 21 when manufacturing the light-emitting functional layer 22 and the cathode layer 21. That is, at a position where the partition groove 45 is located, a material of manufacturing the light-emitting functional layer 22 and a material of manufacturing the cathode layer 21 may be deposited at a bottom of the partition groove 45, so that both of the light-emitting functional layer 22 and the cathode layer 21 may be disconnected at the position where the partition groove 45 is located. As a result, it is conducive for subsequent encapsulation layer to achieve good encapsulation.

Being substantially in the shape of the inverted "T" may refer to being in the described shape (i.e., the shape of the inverted "T") or being in a shape similar to the described shape such as a shape of an inverted "T" whose edge has a curvature or is in a shape of a zigzag.

In some embodiments of the present disclosure, as shown in FIGS. 3 and 4, the at least one insulating layer 4 includes a first inorganic insulating layer 41 and a first organic insulating layer 42 that are sequentially away from the cathode layer 21. The partition groove 45 passes through the first inorganic insulating layer 41 and at least a portion of the first organic insulating layer 42. It is worth pointing out that, in some examples, by directly etching the first inorganic insulating layer 41 and the first organic insulating layer 42 that are arranged in a stack, the partition groove 45 having the cross section substantially in the shape of the inverted "T" may be obtained. In this case, it is possible to have advantages of simple process and convenient manufacture.

In some embodiments, as shown in FIGS. 3 and 4, the display substrate 100 further includes at least one signal line 5 disposed on the first side of the flexible substrate 1 and located in the non-display area $Q_2$. A signal line 5 has at least one first avoidance opening 51, and a first avoidance opening 51 is configured to expose the hole(s) 3. For example, in the examples as shown in FIGS. 3 and 4, each first avoidance opening 51 may expose a single hole 3. Of course, in other examples, the first avoidance opening 51 may be provided to expose two or more holes 3, which is not limited in the present disclosure.

Figure 5A:
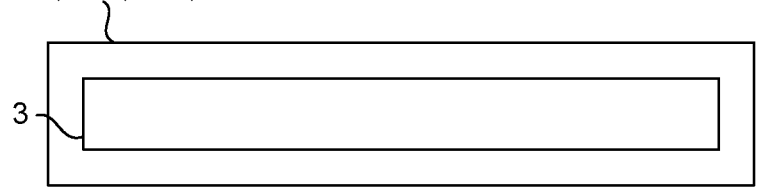
FIG. 5A is a diagram showing a relative positional relationship between any of a first avoidance opening to a fifth avoidance opening and a hole 3, in accordance with some embodiments.
Figure 5B:
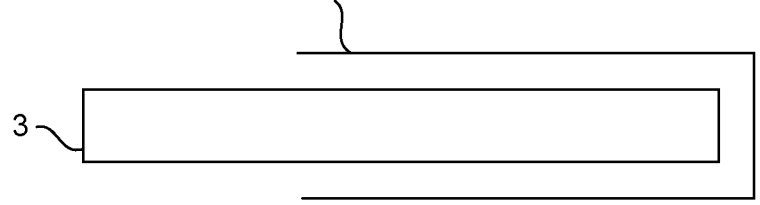
FIG. 5B is a diagram showing another relative positional relationship between any of a first avoidance opening to a fifth avoidance opening and a hole 3, in accordance with some embodiments.

A sidewall of the first avoidance opening 51 may be in a shape of a closed annulus as shown in FIG. 5A (for example, an orthographic of the sidewall of the first avoiding opening 51 on the flexible substrate 1 may be disposed around the hole 3 in a circle; alternatively, the sidewall of the first avoidance opening 51 may be in a shape of a partial annulus with an opening (i.e., an unclosed annulus) as shown in FIG. 5B (for example, the orthographic of the sidewall of the first avoiding opening 51 on the flexible substrate 1 may be disposed around the hole 3 in a half circle or a one-third circle).

The at least one insulating layer 4 covers the sidewall of the first avoidance opening 51; alternatively, the at least one insulating layer 4 covers the sidewall of the first avoidance opening 51 and a portion, proximate to the first avoidance opening 51, of a surface of the signal line 5 away from the flexible substrate 1.

In this way, the at least one insulating layer 4 may be used to protect a sidewall of the signal line 5 proximate to the hole(s) 3 (i.e., the sidewall of the first avoidance opening 51), or the at least one insulating layer 4 may be used to protect both of the sidewall of the signal line 5 proximate to the hole(s) 3 (i.e., the sidewall of the first avoidance opening 51) and the portion, proximate to the first avoidance opening 51, of the surface of the signal line 5 away from the flexible substrate 1.

It is worth pointing out that a material of the signal line 5 may generally include metal such as aluminum (Al). By providing the at least one insulating layer 4, the moisture may be prevented from permeating from the hole(s) 3 to the signal line 5, so that problems such as corrosion of Al may be prevented from occurring in the signal line 5; furthermore, during the subsequent etching process, it is also possible to prevent a replacement reaction from undergoing between the Al in the signal line 5 and silver (Ag) ions in an etching solution. Therefore, the at least one insulating layer 4 may protect the signal line 5 effectively.

For example, as shown in FIGS. 3 and 4, the signal line 5 includes a first metal layer 52 and a second metal layer 53 that are sequentially away from the flexible substrate 1. In this way, it is conducive to reducing a resistance of the signal line 5 and improve a signal transmission efficiency.

On this basis, as shown in FIGS. 3 and 4, the at least one insulating layer 4 may include the first organic insulating layer 42 and a second organic insulating layer 43 that are sequentially proximate to the flexible substrate 1.

The second organic insulating layer 43 covers a side of the first metal layer 52 proximate to the holes 3 and a portion of a surface of the first metal layer 52 away from the flexible substrate 1.

The second metal layer 53 is in electrical contact with the first metal layer 52, and the second metal layer 53 covers a side of the second organic insulating layer 43 away from the hole 3 and a portion of a surface of the second organic insulating layer 43 away from the flexible substrate 1.

The first organic insulating layer 42 covers a side of the second metal layer 53 proximate to the hole 3 and a portion of a surface of the second metal layer 53 away from the flexible substrate 1.

With this design, the first organic insulating layer 42 and the second organic insulating layer 43 may be used to effectively protect the first metal layer 52 and the second metal layer 53 of the signal line 5.

On this basis, for example, as shown in FIGS. 3 and 4, the at least one insulating layer 4 further includes the first inorganic insulating layer 41 and a second inorganic insulating layer 44.

A portion of the second inorganic insulating layer 44 is located between the second organic insulating layer 43 and the flexible substrate 1, another portion of the second inorganic insulating layer 44 is located between the first metal layer 52 and the second metal layer 53, and yet another portion of the second inorganic insulating layer 44 is located between the first metal layer 52 and the second organic insulating layer 43.

The first inorganic insulating layer 41 covers at least a portion of a surface of the first organic insulating layer 42 away from the flexible substrate 1, a side of the first organic insulating layer 42 proximate to the hole 3 and a side of the second organic insulating layer 43 proximate to the hole 3, and the first inorganic insulating layer 41 is in contact with the second inorganic insulating layer 44.

With this design, since the first inorganic insulating layer 41 and the second inorganic insulating layer 44 have a good barrier capability, four insulating layers (i.e., the first inorganic insulating layer 41, the first organic insulating layer 42, the second organic insulating layer 43 and the second inorganic insulating layer 44) may be used to protect the signal line 5 more effectively.

In the process of manufacturing the display substrate 100, for example, after the first inorganic insulating layer 41, the first organic insulating layer 42, the second organic insulating layer 43 and the second inorganic insulating layer 44 are formed, the hole 3 (e.g. the via hole or the blind hole) passing through the first inorganic insulating layer 41 and the second inorganic insulating layer 44 may be formed by etching a position where the first inorganic insulating layer 41 is in contact with the second inorganic insulating layer 44 by an etching process.

Figure 6A:
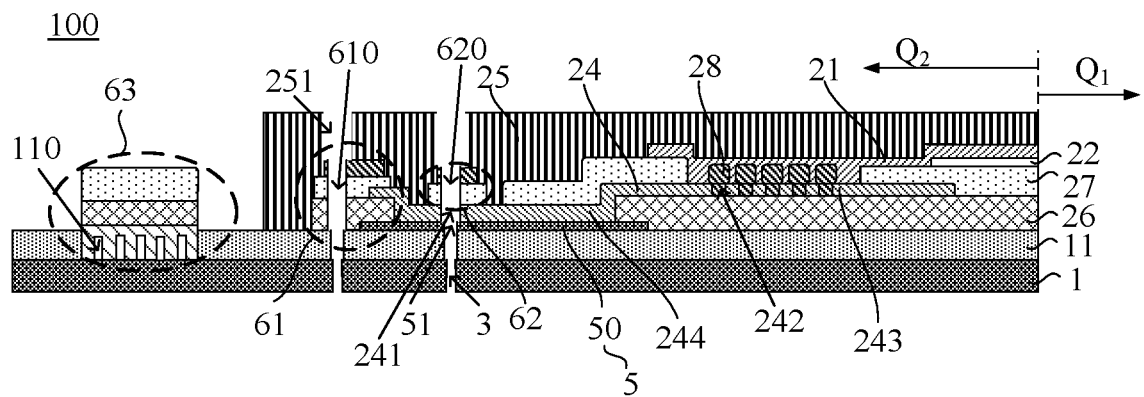
FIG. 6A is a diagram showing a sectional structure of the display substrate in FIG. 1 taken along the line C-C', in accordance with some embodiments.

In some embodiments of the present disclosure, as shown in FIG. 6A, the signal line 5 may be a voltage signal line 50 located in the non-display area $Q_2$, and the voltage signal line 50 may be disposed around the display area $Q_1$.

Referring to FIGS. 3, 4, 6A and 6B, the display substrate 100 further includes a cathode lapping layer 24 located in the non-display area $Q_2$. As shown in FIG. 6A, the cathode lapping layer 24 includes a first portion 243 and a second portion 244 connected to each other. The first portion 243 is electrically connected to a surface of the cathode layer 21 proximate to the flexible substrate 1, and the second portion 244 is connected to a surface of the voltage signal line 50 away from the flexible substrate 1.

As shown in FIGS. 3, 4 and 6A, the cathode lapping layer 24 has at least one second avoidance opening 241, and the second avoidance opening 241 is configured to expose the hole 3.

A sidewall of the second avoidance opening 241 may be in the shape of the closed annulus as shown in FIG. 5A (for example, an orthographic of the sidewall of the second avoiding opening 241 on the flexible substrate 1 may be disposed around the hole 3 in a circle); alternatively, the sidewall of the second avoidance opening 241 may be in the shape of the partial annulus with the opening (i.e., the unclosed annulus) as shown in FIG. 5B (for example, the orthographic of the sidewall of the second avoiding opening 241 on the flexible substrate 1 may be disposed around the hole 3 in a half circle or a one-third circle).

With this design, the cathode lapping layer 24 located in the non-display area $Q_2$ may avoid the holes 3. That is, the arrangement of the cathode lapping layer 24 does not affect the arrangement positions of the holes 3 in the non-display area $Q_2$, so that the stretchable region A of the flexible substrate 1 may have basically the same stretchability in the display area $Q_1$ and the non-display area $Q_2$.

For example, referring to FIGS. 3 and 4, the at least one insulating layer 4 covers a sidewall of the second avoidance opening 241. In this way, the at least one insulating layer 4 may be used to protect a sidewall of the cathode lapping layer 24 proximate to the hole 3 (i.e., the sidewall of the second avoidance opening 241), thereby preventing the cathode lapping layer 24 from being corroded by moisture and oxygen, and preventing a replacement reaction from undergoing between metal in the cathode lapping layer 24 and metal ions in an etching solution.

For another example, the at least one insulating layer 4 covers the sidewall of the second avoidance opening 241 and a portion, proximate to the second avoidance opening 241, of a surface of the cathode lapping layer 24 away from the flexible substrate 1. In this way, the at least one insulating layer 4 may be used to better protect the cathode lapping layer 24, thereby preventing the cathode lapping layer 24 from being corroded by the moisture and the oxygen, and preventing the replacement reaction from undergoing between the metal in the cathode lapping layer 24 and the metal ions in the etching solution.

The cathode lapping layer 24 and the anode 23 may be made in the same layer with the same material. In this way, it is conducive to simplifying the manufacturing process of the display substrate 100.

On the basis of some of the above embodiments, for example, referring to FIG. 6A, the display substrate 100 further includes a first blocking dam 61, a second blocking dam 62 and an encapsulation layer 25.

As shown in FIG. 6A, the first blocking dam 61 is disposed on the first side of the flexible substrate 1, the first blocking dam 61 is located in the non-display area $Q_2$ and disposed around the display area $Q_1$, and the first blocking dam 61 covers at least a side of the voltage signal line 50 away from the display area $Q_1$ and a side of the cathode lapping layer 24 away from the display area $Q_1$. The first blocking dam 61 has at least one third avoidance opening 610, and a third avoidance opening 610 is configured to expose another hole 3.

A sidewall of the third avoidance opening 610 may be in the shape of the closed annulus as shown in FIG. 5A (for example, an orthographic of the sidewall of the third avoiding opening 610 on the flexible substrate 1 may be disposed around the hole 3 in a circle); alternatively, the sidewall of the third avoidance opening 610 may be in the shape of the partial annulus with the opening (i.e., the unclosed annulus) as shown in FIG. 5B (for example, the orthographic of the sidewall of the third avoiding opening 610 on the flexible substrate 1 may be disposed around the hole 3 in a half circle or a one-third circle).

In addition, the third avoidance opening 610 is configured to not penetrate both of a side of the first blocking dam 61 proximate to the display area $Q_1$ and a side of the first blocking dam 61 away from the display area $Q_1$. In this way, in the process of manufacturing the display substrate 100, the first blocking dam 61 may block a material on a side thereof proximate to the display area from flowing to a side thereof away from the display area, so that the good encapsulation of the display substrate 100 may be achieved.

For example, as shown in FIG. 6A, the first blocking dam 61 further covers a portion (i.e., a portion, proximate to the first blocking dam 61, of the entire surface of the voltage signal line 50 away from the flexible substrate 1) of the surface of the voltage signal line 50 away from the flexible substrate 1 and a portion (i.e., a portion, proximate to the first blocking dam 61, of the entire surface of the cathode lapping layer 24 away from the flexible substrate 1) of the surface of the cathode lapping layer 24 away from the flexible substrate 1.

With continued reference to FIG. 6A, in some examples, the first blocking dam 61 may be of a three-layer structure. For example, in a direction away from the flexible substrate 1, a first layer thereof and a planarization layer 26 may be made in a same layer with same material, a second layer thereof and a pixel definition layer 27 may be made in a same layer with a same material, and a third layer thereof and a filling layer 28 may be made in a same layer with a same material.

The planarization layer 26 may include the first organic insulating layer and/or the second organic insulating layer.

The pixel definition layer 27 extends from the display area $Q_1$ to the non-display area $Q_2$, and a border of the pixel definition layer 27 is located in the non-display area $Q_2$. The pixel definition layer 27 has openings used to define a plurality of sub-pixel regions.

In some examples, as shown in FIG. 6A, the cathode lapping layer 24 has a plurality of holes 242 arranged in an array, and at least one hole 242 of the plurality of holes 242 penetrates the cathode lapping layer 24. Orthogonal projections of at least a part of holes 242 of the plurality of holes 242 on the flexible substrate 1 are within an orthographic projection of the planarization layer 26 on the flexible substrate 1. In this way, in the process of manufacturing the display substrate 100, it is possible to release gas generated in a film layer (e.g., the planarization layer 26) below the cathode lapping layer 24, thereby improving a reliability of the display substrate.

The filling layer 28 may be used to fill the holes 242 in the cathode lapping layer 24. In this way, an upper surface of the cathode lapping layer 24 may be planarized to facilitate manufacturing of other film layers on the cathode lapping layer 24.

Here, it will be noted that in a case where the cathode layer 21 overlaps with the cathode lapping layer 24, a region where they are actually electrically connected is in a shape of a mesh, and a portion filled with a material of the filling layer in the middle of the mesh is non-conductive.

As shown in FIG. 6A, the second blocking dam 62 is disposed on the first side of the flexible substrate 1, and the second blocking dam 62 is located in the non-display area $Q_2$ and disposed around the display area $Q_1$. The second blocking dam 62 is located on a surface of the second portion 244 of the cathode lapping layer 24 away from the flexible substrate 1. The second blocking dam 62 has at least one fourth avoidance opening 620, and a fourth avoidance opening 620 is configured to expose the hole 3, the first avoidance opening 51 and the second avoidance opening 241.

A sidewall of the fourth avoidance opening 620 may be in the shape of the closed annulus as shown in FIG. 5A (for example, an orthographic of the sidewall of the fourth avoiding opening 620 on the flexible substrate 1 may be disposed around the hole 3 in a circle); alternatively, the sidewall of the fourth avoidance opening 620 may be in the shape of the partial annulus with the opening (i.e., the unclosed annulus) as shown in FIG. 5B (for example, the orthographic of the sidewall of the fourth avoiding opening 620 on the flexible substrate 1 may be disposed around the hole 3 in a half circle or a one-third circle).

In addition, the fourth avoidance opening 620 is configured to not penetrate both of a side of the second blocking dam 62 proximate to the display area $Q_1$ and a side of the second blocking dam 62 away from the display area $Q_1$. In this way, in the process of manufacturing the display substrate 100, the second blocking dam 62 may block a material thereof on the side proximate to the display area $Q_1$ from flowing to a side thereof away from the display area $Q_1$, so that the good encapsulation of the display substrate 100 may be achieved.

In some examples, the second blocking dam 62 may be of a double-layer structure. For example, in the direction away from the flexible substrate 1, a first layer thereof and the pixel definition layer 27 may be made in a same layer with a same material, and a second layer thereof and the filling layer 28 may be made in a same layer with a same material.

Figure 6B:
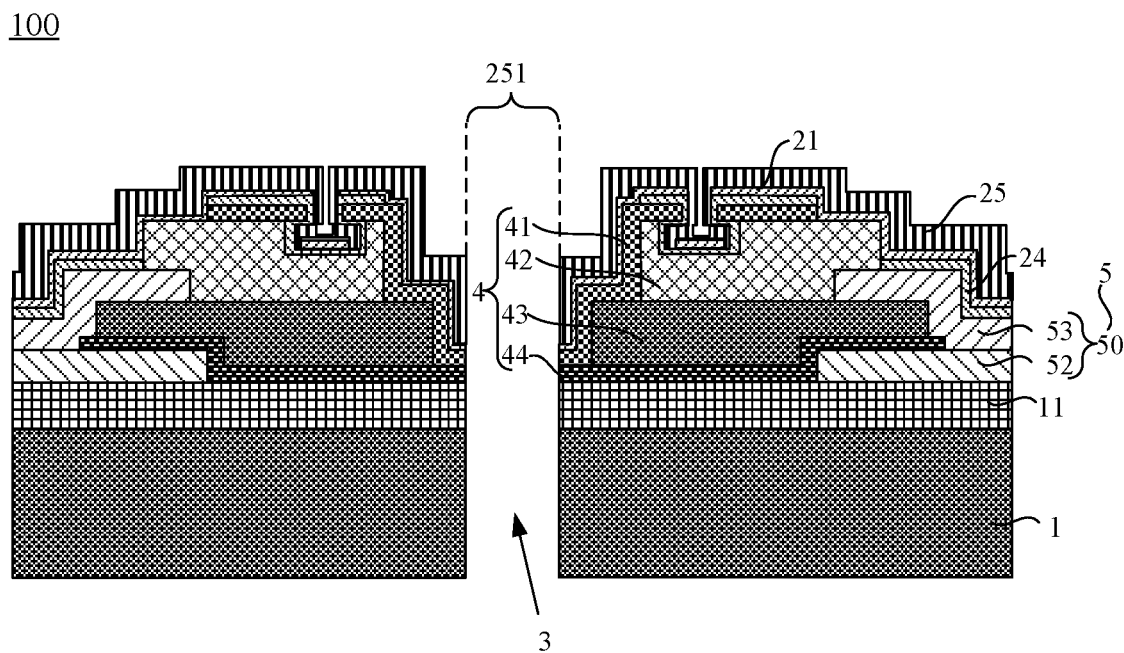
FIG. 6B is a diagram showing a sectional structure of the display substrate in FIG. 1 taken along the line D-D', in accordance with some embodiments.

Referring to FIGS. 6A and 6B, the encapsulation layer 25 is disposed on the first side of the flexible substrate 1, and the encapsulation layer 25 covers the cathode layer 21, the first blocking dam 61 and the second blocking dam 62; the encapsulation layer 25 has at least one fifth avoidance opening 251, and the fifth avoidance opening 251 is configured to expose a corresponding hole 3 of the plurality of the holes 3.

A sidewall of the fifth avoidance opening 251 may be in the shape of the closed annulus as shown in FIG. 5A (for example, an orthographic of the sidewall of the fifth avoiding opening 251 on the flexible substrate 1 may be disposed around the hole 3 in a circle); alternatively, the sidewall of the fifth avoidance opening 251 may be in the shape of the partial annulus with the opening (i.e., the unclosed annulus) as shown in FIG. 5B (for example, the orthographic of the sidewall of the fifth avoiding opening 251 on the flexible substrate 1 may be disposed around the hole 3 in a half circle or a one-third circle).

In some embodiments of the present disclosure, referring to FIGS. 3, 4, 6A and 6B, the display substrate 100 may further include a buffer layer 11 located on the first side of the flexible substrate 1. The buffer layer 11 extends from the display area $Q_1$ to the non-display area $Q_2$, and a border of the buffer layer 11 is located on the side of the first blocking dam 61 away from the display area $Q_1$. The buffer layer 11 has openings exposing the holes 3.

It will be noted that, in the embodiments of the present disclosure, in order to describe the structure of the display substrate clearly and briefly, FIGS. 3, 4, 6A and 6B are each only show a sectional structure of the display substrate, and not a sectional view (that is, connection relationships other than the sectional portion are not illustrated in the figures). Therefore, it will be understood that, at least two parts that are separated in each figure may be essentially connected together.

On this basis, for example, as shown in FIG. 6A, a portion of the buffer layer 11 extending to the side of the first blocking dam 61 away from the display area $Q_1$ has at least one groove 110 formed therein, and the groove 110 is disposed around the first blocking dam 61. In this way, in the process of manufacturing the display substrate 100, the groove 110 may prevent outer cracks from extending inward to affect the display area $Q_1$, thereby improving the reliability of the display substrate 100.

For example, as shown in FIG. 6A, a third blocking dam 63 may be provided on a side of the groove 110 away from the flexible substrate 1. The third blocking dam 63 may achieve a better effect of blocking the cracks extension.

Figure 7:
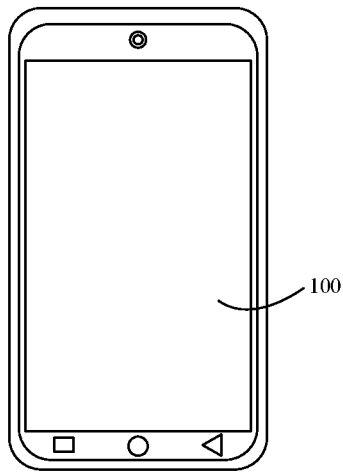
FIG. 7 is a diagram showing a structure of a display apparatus, in accordance with some embodiments.

Some embodiments of the present disclosure provide a display apparatus 200, as shown in FIG. 7, the display apparatus 200 includes the display substrate 100 as described in any one of the above embodiments.

For example, the display apparatus 200 may be, for example, any product or component having a display function, such as a mobile phone, a tablet computer, a television, a monitor, a notebook computer, a digital photo frame or a navigator.

As for technical effects of the display apparatus 200, reference may be made to technical effects of the display substrate as described in any one of the above embodiments, and details will not be repeated here.

Figure 8:
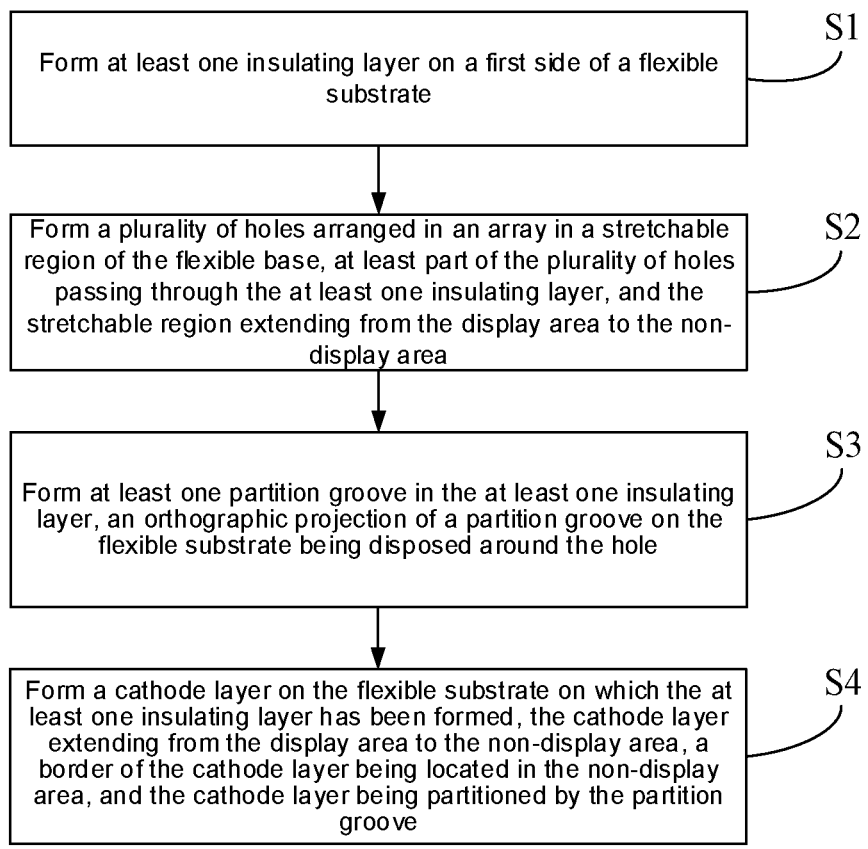
FIG. 8 is a flow diagram of a manufacturing method of a display substrate, in accordance with some embodiments.

Some embodiments of the present disclosure provide a manufacturing method of a display substrate, referring to FIG. 1, the display substrate 100 has a display area $Q_1$ and a non-display area $Q_2$ adjacent to the display area $Q_1$. Referring to FIGS. 2, 3 and 8, the manufacturing method includes following steps.

In S1, at least one insulating layer 4 (e.g., a first inorganic insulating layer 41, a first organic insulating layer 42, a second organic insulating layer 43 and a second inorganic insulating layer 44) is formed on a first side of a flexible substrate 1.

In S2, a plurality of holes 3 arranged in an array are formed in a stretchable region A of the flexible substrate 1; at least part of the plurality of holes 3 pass through the at least one insulating layer 4, and the stretchable region A extends from the display area $Q_1$ to the non-display area $Q_2$.

In S3, at least one partition groove 45 is formed in the at least one insulating layer 4; an orthographic projection of a partition groove 45 on the flexible substrate 1 is disposed around the hole 3 (for example, the orthographic projection of the partition groove 45 on the flexible substrate 1 may be disposed around the hole 3 in a circle, alternatively, the orthographic projection of the partition groove 45 on the flexible substrate 1 may be disposed around the hole 3 only in a half circle or a one-third circle).

The partition groove 45 may be disposed, for example, in a portion of the at least one insulating layer 4 covered by a cathode layer 21. "The portion of the at least one insulating layer 4 covered by the cathode layer 21" refers to at least a portion of the at least one insulating layer 4 covered by a designed border of the cathode layer 21. It will be understood that in an actual manufacturing, for example, in a case where the cathode layer 21 is manufactured by an evaporation process, there may be a certain deviation between an actual evaporation border of the cathode layer 21 and the designed border of the cathode layer 21. Therefore, in an actual product, the partition groove 45 may be further disposed in a portion of the at least one insulating layer 4 not covered by the cathode layer 21.

In S4, a cathode layer 21 is formed on the flexible substrate 1 on which the at least one insulating layer 4 has been formed; the cathode layer 21 extends from the display area $Q_1$ to the non-display area $Q_2$, a border of the cathode layer 21 is located in the non-display area $Q_2$, and the cathode layer 21 is partitioned by the partition groove 45.

In this way, after the display substrate 100 is encapsulated, moisture may be prevented from permeating from a side of the partition groove 45 proximate to the hole 3 to a side of the partition groove 45 away from the hole 3 through the cathode layer 21, so as to ameliorate a problem that the moisture is prone to corrode the cathode layer 21 while the hole 3 is provided, thereby reducing an influence of the external moisture on the display substrate 100.

On this basis, for example, referring to FIG. 4, before forming the cathode layer 21, the manufacturing method further includes: forming a light-emitting functional layer 22 (e.g., an electron transporting layer, an electron injection layer, an organic light-emitting layer, a hole injection layer and a hole transporting layer) on the first side of the flexible substrate 1. The light-emitting functional layer 22 extends from the display area $Q_1$ to the non-display area $Q_2$, and a border of the light-emitting functional layer 22 is located between the border of the cathode layer 21 and a border of the display area $Q_1$; at least a part of the partition grooves 45 partition both of the cathode layer 21 and the light-emitting functional layer 22.

In this way, after the display substrate 100 is encapsulated, the moisture may be prevented from permeating from the side of the partition groove 45 proximate to the hole 3 to the side of the partition groove 45 away from the hole 3 through the light-emitting functional layer 22, so as to ameliorate a problem that the moisture is prone to corrode the light-emitting functional layer 22 and the cathode layer 21 while the hole 3 is provided, thereby reducing the influence of the external moisture on the display substrate 100.

In some embodiments, referring to FIGS. 3 and 4, the at least one insulating layer 4 includes a first inorganic insulating layer 41 and a first organic insulating layer 42 that are sequentially away from the cathode layer 21.

Forming the at least one partition groove 45 on the at least one insulating layer 4 includes: etching the first inorganic insulating layer 41 and at least a portion of the first organic insulating layer 42 by an etching process to form the at least one partition groove 45.

With this design, it is conducive to simplifying the manufacturing process, thus facilitating the rapid processing of the partition groove 45.

It will be noted that the manufacturing method of the display substrate provided by some embodiments of the present disclosure is used to manufacture the display substrate 100 as described in any one of the above embodiments. Therefore, the manufactured display substrate 100 has all of the beneficial effects described above, and details will not be repeated here.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate having a display area and a non-display area adjacent to the display area; the display substrate comprising:
   a flexible substrate, the flexible substrate including at least one stretchable region, the stretchable region extending from the display area to the non-display area, and the stretchable region being provided with a plurality of holes arranged in an array therein;
   a cathode layer located on a first side of the flexible substrate, the cathode layer extending from the display area to the non-display area, and a border of the cathode layer being located in the non-display area; and
   at least one insulating layer located between the flexible substrate and the cathode layer, the at least one insulating layer being configured to expose the plurality of holes; wherein the at least one insulating layer is provided with at least one partition groove therein, an orthographic projection of a partition groove on the flexible substrate is disposed around a hole of the plurality of holes, and the partition groove is configured to partition the cathode layer.

2. The display substrate according to claim 1, further comprising:
   a light-emitting functional layer located between the cathode layer and the at least one insulating layer; the light-emitting functional layer extending from the display area to the non-display area, and a border of the light-emitting functional layer being located between the border of the cathode layer and a border of the display area;
   wherein the at least one partition groove includes partition grooves, and at least a part of the partition grooves each partition both of the cathode layer and the light-emitting functional layer.

3. The display substrate according to claim 1, wherein a section obtained by sectioning the partition groove with a plane parallel to both of a radial direction of the hole and a thickness direction of the display substrate is substantially in a shape of an inverted "T".

4. The display substrate according to claim 1, wherein the at least one insulating layer includes a first inorganic insulating layer and a first organic insulating layer that are sequentially away from the cathode layer; and
   the partition groove passes through the first inorganic insulating layer and at least a portion of the first organic insulating layer.

5. The display substrate according to claim 1, further comprising:
   at least one signal line disposed on the first side of the flexible substrate and located in the non-display area; a signal line having at least one first avoidance opening, and a first avoidance opening being configured to expose the hole;
   wherein the at least one insulating layer covers a sidewall of the first avoidance opening; or
   the at least one insulating layer covers the sidewall of the first avoidance opening and a portion, proximate to the first avoidance opening, of a surface of the signal line away from the flexible substrate.

6. The display substrate according to claim 5, wherein the signal line includes a first metal layer and a second metal layer that are sequentially away from the flexible substrate; the at least one insulating layer includes a first organic insulating layer and a second organic insulating layer that are sequentially proximate to the flexible substrate;
   the second organic insulating layer covers a side of the first metal layer proximate to the hole and a portion of a surface of the first metal layer away from the flexible substrate;
   the second metal layer is in electrical contact with the first metal layer, and the second metal layer covers a side of the second organic insulating layer away from the hole and a portion of a surface of the second organic insulating layer away from the flexible substrate; and
   the first organic insulating layer covers a side of the second metal layer proximate to the hole and a portion of a surface of the second metal layer away from the flexible substrate.

7. The display substrate according to claim 6, wherein the at least one insulating layer further includes a first inorganic insulating layer and a second inorganic insulating layer;
   a portion of the second inorganic insulating layer is located between the second organic insulating layer and the flexible substrate, another portion of the second inorganic insulating layer is located between the first metal layer and the second metal layer, and yet another portion of the second inorganic insulating layer is located between the first metal layer and the second organic insulating layer; and
   the first inorganic insulating layer covers at least a portion of a surface of the first organic insulating layer away from the flexible substrate, a side of the first organic insulating layer proximate to the hole and a side of the second organic insulating layer proximate to the hole, and the first inorganic insulating layer is in contact with to the second inorganic insulating layer.

8. The display substrate according to claim 5, wherein the signal line is a voltage signal line, and the voltage signal line is disposed around the display area;
the display substrate further comprises:
a cathode lapping layer located in the non-display area, the cathode lapping layer including a first portion and a second portion connected to each other, the first portion being electrically connected to a surface of the cathode layer proximate to the flexible substrate, and the second portion being connected to a surface of the voltage signal line away from the flexible substrate; the cathode lapping layer having at least one second avoidance opening, and a second avoidance opening being configured to expose the hole;
wherein the at least one insulating layer covers a sidewall of the second avoidance opening; or
the at least one insulating layer covers the sidewall of the second avoidance opening and a portion, proximate to the second avoidance opening, of a surface of the cathode lapping layer away from the flexible substrate.

9. The display substrate according to claim 8, further comprising:
a first blocking dam disposed on the first side of the flexible substrate, the first blocking dam being located in the non-display area and disposed around the display area; wherein the first blocking dam covers at least a side of the voltage signal line away from the display area and a side of the cathode lapping layer away from the display area; the first blocking dam has at least one third avoidance opening, and a third avoidance opening is configured to expose another hole of the plurality of holes;
a second blocking dam disposed on the first side of the flexible substrate, the second blocking dam being located in the non-display area and disposed around the display area; wherein the second blocking dam is located on a surface of the second portion of the cathode lapping layer away from the flexible substrate; the second blocking dam has at least one fourth avoidance opening, and a fourth avoidance opening is configured to expose the hole exposed by the second avoidance opening, the first avoidance opening and the second avoidance opening; and
an encapsulation layer disposed on the first side of the flexible substrate; the encapsulation layer covering the cathode layer, the first blocking dam and the second blocking dam; wherein the encapsulation layer has at least one fifth avoidance opening, and a fifth avoidance opening is configured to expose a corresponding hole of the plurality of the holes.

10. The display substrate according to claim 1, wherein the display substrate is in a shape of a rectangle, a number of stretchable regions is four, and the four stretchable regions are respectively located at four corners of the display substrate.

11. The display substrate according to claim 1, wherein the plurality of holes arranged in the array include:
first holes each extending in a first direction; and
second holes each extending in a second direction intersecting the first direction;
wherein the first holes and the second holes are alternately arranged in both of the first direction and the second direction.

12. A display apparatus, comprising:
the display substrate according to claim 1.

13. A manufacturing method of a display substrate, the display substrate having a display area and a non-display area adjacent to the display area; the manufacturing method comprising:
forming at least one insulating layer on a first side of a flexible substrate;
forming a plurality of holes arranged in an array in a stretchable region of the flexible substrate; at least part of the plurality of holes passing through the at least one insulating layer, and the stretchable region extending from the display area to the non-display area;
forming at least one partition groove in the at least one insulating layer; an orthographic of a partition groove on the flexible substrate being disposed around a hole; and
forming a cathode layer on the flexible substrate on which the at least one insulating layer has been formed; wherein the cathode layer extends from the display area to the non-display area, a border of the cathode layer is located in the non-display area, and the cathode layer is partitioned by the partition groove.

14. The manufacturing method according to claim 13, before forming the cathode layer, the manufacturing method further comprising:
forming a light-emitting functional layer on the first side of the flexible substrate; the light-emitting functional layer extending from the display area to the non-display area, and a border of the light-emitting functional layer being located between the border of the cathode layer and a border of the display area;
wherein the at least one partition groove includes partition grooves, and at least a part of the partition grooves each partition both of the cathode layer and the light-emitting functional layer.

15. The manufacturing method according to claim 13, wherein the at least one insulating layer includes a first inorganic insulating layer and a first organic insulating layer that are sequentially away from the cathode layer;
forming the at least one partition groove on the at least one insulating layer, includes:
etching the first inorganic insulating layer and at least a portion of the first organic insulating layer by an etching process to form the at least one partition groove.

16. The display substrate according to claim 9, wherein any one of the first avoidance opening, the second avoidance opening, the third avoidance opening, the fourth avoidance opening and the fifth avoidance opening is in a shape of a closed annulus.

17. The display substrate according to claim 9, wherein any one of the first avoidance opening, the second avoidance opening, the third avoidance opening, the fourth avoidance opening and the fifth avoidance opening is in a shape of an unclosed annulus.

18. The display substrate according to claim 1, wherein the number of stretchable regions is one, and the stretchable region covers all of the display area and all of the non-display area.

* * * * *